United States Patent
Fujimoto et al.

(10) Patent No.: US 7,026,743 B2
(45) Date of Patent: Apr. 11, 2006

(54) SURFACE ACOUSTIC WAVE DEVICE HAVING HIGH DIELECTRIC STRENGTH AND PROCESS FOR MANUFACTURING THE SAME

(75) Inventors: Haruhiko Fujimoto, Niigata-ken (JP); Satoshi Waga, Niigata-ken (JP); Takashi Sato, Niigata-ken (JP); Kyosuke Ozaki, Niigata-ken (JP); Yutaka Matsuo, Fukushima-ken (JP); Takeshi Ikeda, Niigata-ken (JP); Kazuaki Kaneko, Niigata-ken (JP); Takuo Kudo, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 272 days.

(21) Appl. No.: 10/689,811

(22) Filed: Oct. 21, 2003

(65) Prior Publication Data
US 2004/0086740 A1 May 6, 2004

(30) Foreign Application Priority Data
Oct. 31, 2002 (JP) ............................. 2002-318104

(51) Int. Cl.
*H01L 41/08* (2006.01)
(52) U.S. Cl. ................... 310/313 A; 310/364
(58) Field of Classification Search ............ 310/313 A, 310/313 B, 313 R, 364
See application file for complete search history.

(56) References Cited

U.S. PATENT DOCUMENTS

| 5,325,012 | A  | * | 6/1994  | Sato et al. ............... 310/364 |
| 6,377,138 | B1 | * | 4/2002  | Takagi et al. ............ 333/193 |
| 6,774,542 | B1 | * | 8/2004  | Anasako .................. 310/364 |
| 6,826,815 | B1 | * | 12/2004 | Nakagawa et al. ...... 29/25.35 |
| 6,861,786 | B1 | * | 3/2005  | Hakamada ............... 310/364 |

FOREIGN PATENT DOCUMENTS

| JP | 2001-94382 | 4/2001 |
| JP | 2002-26685 | 1/2002 |

\* cited by examiner

*Primary Examiner*—Mark Budd
(74) *Attorney, Agent, or Firm*—Brinks Hofer Gilson & Lione

(57) ABSTRACT

A surface acoustic wave device includes a piezoelectric substrate and an electrode section, disposed on the piezoelectric substrate, having a thin-film structure. The electrode section includes interdigital electrodes and junction electrodes connected to the interdigital electrodes. The interdigital electrodes each include corresponding first base layers containing Ta and Cu layers or Cu—M alloy layers each disposed on the corresponding first base layers, wherein M represents one or more elements selected from the group consisting of Ag, Sn, and C.

12 Claims, 6 Drawing Sheets

SURFACE ACOUSTIC WAVE DEVICE HAVING HIGH DIELECTRIC STRENGTH AND PROCESS FOR MANUFACTURING THE SAME

BACKGROUND OF THE INVENTION

1. Field of the Invention

The present invention relates to a surface acoustic wave device having an electrode structure with high dielectric strength at high frequencies and also relates to a process for manufacturing such a surface acoustic wave device.

2. Description of the Related Art

Surface acoustic wave devices are electronic components using surface acoustic waves, which are mechanical vibrations propagating along surfaces of solid materials, and are used for filters, resonators, and duplexers.

Recently, the miniaturization of mobile communication terminals such as mobile phones has been advancing. Therefore, electronic components of such terminals must be reduced in size.

A surface acoustic wave device includes a piezoelectric substrate and a pair of interdigital electrodes (interdigital transducer (IDT) electrodes), disposed thereon, containing a conductive material having low density. The interdigital electrodes each have electrode fingers that are alternately arranged. Since the surface acoustic wave device has such a simple configuration, the surface acoustic wave device is fit for filters, resonators, and duplexers that must be reduced in size when used for such mobile communication terminals.

A known surface acoustic wave device usually includes interdigital electrodes principally containing Al or an Al alloy having high conductivity and low density, as disclosed in Japanese Unexamined Patent Application Publication No. 2001-94382 (hereinafter referred to as Patent Document 1).

When such a surface acoustic wave device is used as, for example, an antenna duplexer placed in a radio-frequency (RF) section to which high voltage is applied and which is placed downstream a transmitting amplifier, the surface acoustic wave device must have high dielectric strength. Furthermore, since the mobile communication terminals have recently used higher frequencies, the operating frequency of the surface acoustic wave device must be increased from several hundred MHz to several GHz.

In order to increase the frequency, the electrode fingers of the interdigital electrodes of the surface acoustic wave device must be reduced in size and distance between the electrode fingers. For example, bandpass filters with a center frequency of 2 GHz must have a width of about 0.5 μm and bandpass filters with a center frequency of 10 GHz must have a width of about 0.1 μm.

When high-voltage signals are applied to the interdigital electrodes having such fine electrode fingers, the interdigital electrodes suffer from strong stress due to surface acoustic waves. The stress exceeding the critical stress of the interdigital electrodes causes stress migration. The stress migration is such a phenomenon that metal atoms contained in the interdigital electrodes migrate through grain boundaries and/or stable faces of crystals and thereby voids are formed in the interdigital electrodes and/or hillocks are formed thereon. The stress migration causes a breakage of the electrodes, electrical breaks, an increase in insertion loss of elements, a decrease in Q-factor of resonators, and the like, and finally causes a deterioration in property of the surface acoustic wave device.

In particular, the known surface acoustic wave device, disclosed in Patent Document 1, including the interdigital electrodes principally containing Al or an Al alloy has high resistivity and a low melting point. Therefore, when the interdigital electrodes are reduced in size, there is a problem in that the electrical resistance is greatly increased and the resistance to stress increased due to high frequencies is lowered, thereby causing the stress migration to occur.

Another type of interdigital electrodes have been disclosed and such interdigital electrodes principally contain Cu or a Cu alloy instead of the Al or Al alloy.

For example, Japanese Unexamined Patent Application Publication No. 2002-26685 (hereinafter referred to as Patent Document 2) discloses an interdigital electrode for surface acoustic wave devices. This interdigital electrode principally contains Cu or a Cu alloy having low electrical resistance and high resistance to stress migration. Patent Document 2 also discloses a configuration in which a first electrode layer containing Ti or a Ti alloy is placed between a piezoelectric substrate and a second electrode layer containing Cu or a Cu alloy such that the orientation of crystals in the second electrode layer is improved and the second electrode layer is securely joined to the piezoelectric substrate.

In the configuration disclosed in Patent Document 2, since the second electrode layer is directly disposed on the first electrode layer, Ti diffuses into the second electrode layer and Cu diffuses into the first electrode layer at the interface of the first and second electrode layers. Therefore, there is a problem in that such diffusion causes an increase in electrical resistance of the interdigital electrode. When surface acoustic wave devices include interdigital electrodes having high electrical resistance, the surface acoustic wave devices have a large internal loss and the stress migration is apt occur in the surface acoustic wave device.

SUMMARY OF THE INVENTION

In order to solve the above problems, it is an object of the present invention to provide a surface acoustic wave device that includes interdigital electrodes each including a Ta layer and a Cu layer or Cu alloy layer thereon and has high dielectric strength. Furthermore, it is another object of the present invention to provide a process for manufacturing such a surface acoustic wave device.

A surface acoustic wave device of the present invention includes a piezoelectric substrate and an electrode section, disposed on the piezoelectric substrate, having a thin-film structure. The electrode section includes interdigital electrodes and junction electrodes connected to the interdigital electrodes. The interdigital electrodes each include corresponding first base layers containing Ta and Cu layers or Cu—M alloy layers each disposed on the corresponding first base layers, wherein M represents one or more elements selected from the group consisting of Ag, Sn, and C.

In the surface acoustic wave device, the interdigital electrodes include the Cu layers or Cu—M alloy layers. Cu and a Cu—M alloy have a smaller resistivity and a higher melting point as compared with Al or an Al alloy contained in known interdigital electrodes for ordinary surface acoustic wave devices. Therefore, if the interdigital electrodes are reduced in size, the electrical resistance thereof can be prevented from being increased. Furthermore, even if large stresses due to high frequencies are applied to these layers, Cu atoms in the layers are prevented from migrating, thereby allowing the surface acoustic wave device of the present invention to have high resistance to stress migration. That is, when high-frequency signals and a large voltage are applied the surface acoustic wave device, the insertion loss of the surface acoustic wave device can be prevented from being increased and properties of the device can be prevented from being deteriorated; hence, the device has a long life.

In particular, in the surface acoustic wave device, since the Cu layers or Cu—M alloy layers are each disposed on corresponding first base layers, the Cu layers or Cu—M alloy layers have preferred crystal orientation and a fine average grain size. Therefore, the surface acoustic wave device has high resistance to stress migration.

In order to allow the surface acoustic wave device to have high resistance to stress migration, the Cu layers or Cu—M alloy layers preferably have a crystal structure in which crystals are oriented in the (111) direction.

Furthermore, the Cu layers or Cu—M alloy layers preferably have an average grain size ranging from 10 to 100 nm.

Furthermore, the Cu layers or Cu—M alloy layers preferably contain crystal grains having a face-centered cubic structure and the element M is preferably precipitated at grain boundaries.

The element M precipitated at grain boundaries prevents Cu atoms from diffusing at the grain boundaries, thereby allowing the interdigital electrodes to have high strength. That is, even if the mechanical vibration of the surface acoustic wave device is increased due to applied high-frequency signals, the stress migration can be prevented from occurring in the interdigital electrodes, thereby preventing the interdigital electrodes from being damaged. Furthermore, the orientation of Cu grains is improved and the electrical resistance of the interdigital electrodes is lowered.

In the surface acoustic wave device, the element M is, for example, Ag. Furthermore, the Ag content of the Cu—M alloy layers preferably ranges from 0.5 to 10% by mass and more preferably ranges from 0.8 to 10% by mass. Thereby, the surface acoustic wave device is allowed to have high dielectric strength.

The surface acoustic wave device preferably further includes second base layers each disposed under the corresponding first base layers, and the second base layers preferably contain titanium and/or titanium oxides. Therefore, crystals in the Cu layers or Cu—M alloy layers are predominantly oriented in the (111) direction, thereby allowing the surface acoustic wave device to have high resistance to stress migration. In the surface acoustic wave device, the second base layers preferably have a configuration in which the titanium oxides are disposed on a region containing only titanium and the oxygen content of the titanium oxides gradually increases from the lower faces of the second base layers toward the upper faces. The titanium oxides disposed under the upper faces of the second base layer are substantially amorphous, and therefore the first base layers disposed on the second base layers are hardly affected by the crystallinity of the second base layers. Therefore, the first base layers have a small grain size, and the Cu layers or Cu—M alloy layers disposed on the first base layers also have a small grain size. When the grain size of the Cu layers or Cu—M alloy layers is small, the crystals in the Cu layers or Cu—M alloy layers are predominantly oriented in the (111) direction, thereby allowing the surface acoustic wave device to have high resistance to stress migration.

When only the first base layers are each disposed between the substrate and the corresponding Cu layers or Cu—M alloy layers, the first base layers preferably have a thickness ranging from 5 to 15 nm. Thereby, the crystals in the Cu layers or Cu—M alloy layers are predominantly oriented in the (111) direction.

The first base layers having an excessively large thickness cause a deterioration in high-frequency property of the surface acoustic wave device. When the first base layers have a thickness of 15 nm or less, such a deterioration can be prevented from being caused.

When each second base layer and first base layer are disposed between the substrate and each Cu layer or Cu—M alloy layer, the second base layer preferably has a thickness ranging from 3 to 15 nm. Thereby, the crystals in the Cu layer or Cu—M alloy layer are predominantly oriented in the (111) direction.

In the surface acoustic wave device, the Cu layers or Cu—M alloy layers preferably have a thickness ranging from 30 to 150 nm.

The surface acoustic wave device preferably further includes protective layers, each disposed on the corresponding Cu layers or Cu—M alloy layers, containing Cr. Thereby, the Cu layers or Cu—M alloy layers can be prevented from being oxidized and/or corroded.

A process for manufacturing a surface acoustic wave device according to the present invention includes the following steps:

(a) a step of forming a multi-layer film including a first base precursor layer containing Ta and a Cu precursor layer or a multi-layer film including the first base precursor layer and a Cu—M alloy precursor layer on a piezoelectric substrate, the first base precursor layer and Cu precursor layer or the first base precursor layer and Cu—M alloy precursor layer being continuously formed, wherein M represents one or more elements selected from the group consisting of Ag, Sn, and C;

(b) a step of etching the multi-layer film to form interdigital electrodes;

(c) a step of forming junction electrodes each connected to the corresponding interdigital electrodes; and (d) a step of heat-treating the piezoelectric substrate having the interdigital electrodes and junction electrodes thereon.

In the above process, the interdigital electrodes contain Cu or a Cu—M alloy. Therefore, when the interdigital electrodes are reduced in size, the electrical resistance thereof can be prevented from being increased. Furthermore, even if a large stress due to high frequencies is applied to the surface acoustic wave device, Cu atoms are prevented from migrating, thereby allowing the surface acoustic wave device to have high resistance to stress migration.

In the above process, since the Cu precursor layer or Cu—M alloy precursor layer is placed on the first base precursor layer, Cu crystals in the Cu precursor layer or Cu—M alloy precursor layer are highly oriented and have a fine average size, thereby allowing the surface acoustic wave device to have high resistance to stress migration.

When the Cu—M alloy precursor layer is used, the element M is precipitated at grain boundaries in the heat-treating step. Since the element M precipitated at the grain boundaries prevents Cu atoms from diffusing at the grain boundaries, the interdigital electrodes have high strength. Thus, even if the mechanical vibration of the surface acoustic wave device is increased due to applied high-frequency signals, the stress migration can be prevented from occurring in the interdigital electrodes, thereby preventing the interdigital electrodes from being damaged. Furthermore, the orientation of Cu grains is improved and the electrical resistance of the interdigital electrodes is lowered.

A process for manufacturing a surface acoustic wave device according to the present invention includes the following steps:

(a) a step of forming a second base precursor layer containing Ti on a piezoelectric substrate and then exposing the second base precursor layer to the atmosphere;

(b) a step of continuously forming a first base precursor layer containing Ta and a Cu precursor layer on the second base precursor layer or continuously forming the first base precursor layer and a Cu—M alloy precursor layer on the second base precursor layer, wherein M represents one or more elements selected from the group consisting of Ag, Sn, and C;

(c) a step of etching the second base precursor layer, first base precursor layer, and Cu precursor layer or etching the second base precursor layer, first base precursor layer, and Cu—M alloy precursor layer to form interdigital electrodes;

(d) a step of forming junction electrodes each connected to the corresponding interdigital electrodes; and (e) a step of heat-treating the piezoelectric substrate having the interdigital electrodes and junction electrodes thereon.

In the above process, the second base precursor layer is oxidized when the second base precursor layer is exposed to the atmosphere.

According to the above oxidation, the second base precursor layer has a configuration in which titanium oxides are placed on a region containing only titanium and the oxygen content of the titanium oxides gradually increases from the lower face of the second base precursor layer toward the upper face thereof. Since the titanium oxides disposed under the upper face of the second base precursor layer are substantially amorphous, the first base precursor layer disposed on the second base precursor layer is hardly affected by the crystallinity of the second base precursor layer. Therefore, the first base precursor layer has a small grain size, and the Cu precursor layer or Cu—M alloy precursor layer disposed on the first base precursor layer also has a small grain size. When the grain size of the Cu precursor layer or Cu—M alloy precursor layer is small, crystals in the Cu precursor layer or Cu—M alloy precursor layer are predominantly oriented in the (111) direction, thereby allowing the surface acoustic wave device to have high resistance to stress migration.

In the above process, the second base precursor layer hardly contains the titanium oxides or contains only the titanium oxides depending on the temperature and time of the step of exposing the second base precursor layer to the atmosphere.

If the second base precursor layer hardly contains the titanium oxides, the crystals in the Cu precursor layer or Cu—M alloy precursor layer having the first and second base precursor layers thereunder are more predominantly oriented in the (111) direction as compared with the Cu precursor layer or Cu—M alloy precursor layer having only the first base precursor layer thereunder.

In a process of the present invention, when a protective precursor layer containing Cr is placed on the Cu precursor layer or Cu—M alloy precursor layer, the Cu precursor layer or Cu—M alloy precursor layer can be prevented from being oxidized and/or corroded.

In a process of the present invention, the element M is, for example, Ag. The Ag content of the Cu—M alloy precursor layer is preferably 0.5 to 10% by mass and more preferably 0.8 to 10% by mass. Thereby, the surface acoustic wave device having high dielectric strength can be obtained.

In a process of the present invention, the temperature of a heat-treating step is preferably 250 to 300° C. Thereby, the surface acoustic wave device having high dielectric strength can be obtained.

DESCRIPTION OF THE PREFERRED EMBODIMENTS

Figure 1:
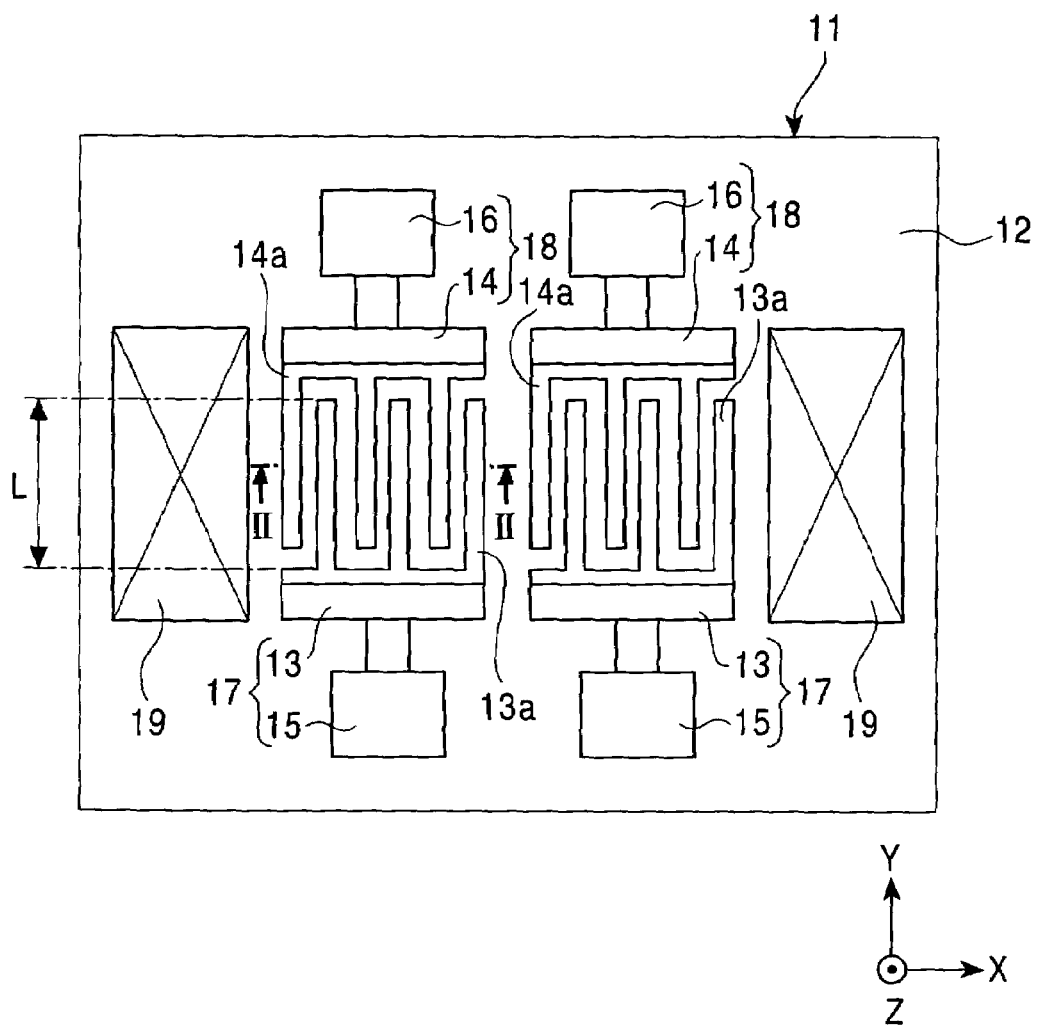
FIG. 1 is a plan view showing a surface acoustic wave device according to a first embodiment of the present invention.

FIG. 1 is a plan view showing a surface acoustic wave device according to a first embodiment of the present invention.

Reference numeral 11 represents the surface acoustic wave device, which functions as a branching filter. Reference numeral 12 represents a piezoelectric substrate. In this embodiment, the piezoelectric substrate 12 contains a piezoelectric ceramic material such as $LiTaO_3$ or $LiNbO_3$.

The piezoelectric substrate 12 has first interdigital electrodes 13 and second interdigital electrodes 14 thereon. The first interdigital electrodes 13 each include corresponding first electrode fingers 13a extending in the Y direction shown in FIG. 1, and the second interdigital electrodes 14 each include corresponding second electrode fingers 14a extending in reverse to the Y direction. The first and second electrode fingers 13a and 14a are alternately arranged at predetermined intervals in the X direction shown in FIG. 1.

The first interdigital electrodes 13 are each electrically connected to corresponding first junction electrodes 15 and the second interdigital electrodes 14 are each electrically connected to corresponding second junction electrodes 16. The first and second junction electrodes 15 and 16 are used for connecting the surface acoustic wave device 11 to an external circuit. A pair of each first interdigital electrode 13 and first junction electrode 15 form a first electrode section 17, and a pair of each second interdigital electrode 14 and second junction electrode 16 form a second electrode section 18.

Reflective electrodes 19 are arranged in the X direction with the first and second interdigital electrodes 13 and 14 disposed therebetween.

Figure 2:
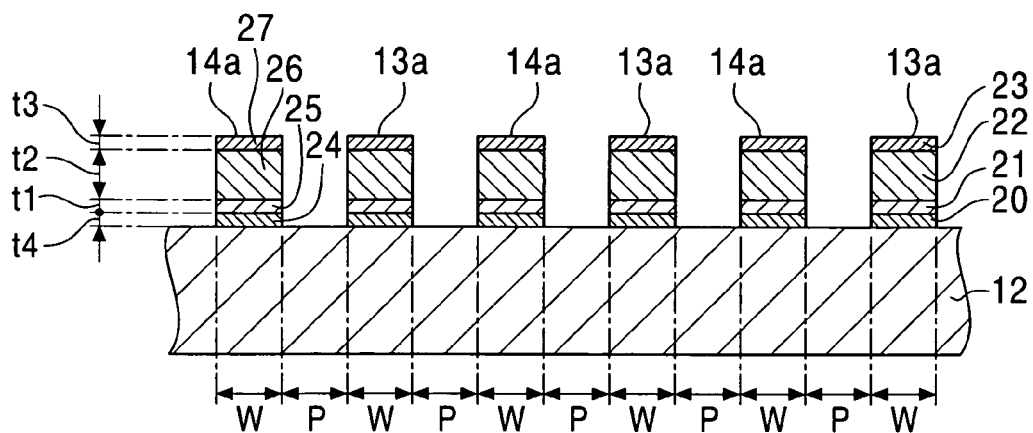
FIG. 2 is a sectional view showing the surface acoustic wave device taken along the line II—II of FIG. 1.

FIG. 2 is a sectional view showing the first and second interdigital electrodes 13 and 14 taken along the line II—II when viewed in the direction indicated by the arrows.

In this embodiment, the first interdigital electrodes 13 each include corresponding second base layers 20, first base layers 21 containing Ta, first Cu—M alloy layers 22, and first protective layers 23, wherein these layers are disposed in that order and M represents one or more elements selected from the group consisting of Ag, Sn, and C. The second interdigital electrodes 14 also each include corresponding fourth base layers 24, third base layers 25 containing Ta, second Cu—M alloy layers 26, and second protective layers 27, wherein these layers are disposed in that order and M is as specified in the above. The fourth base layers 24 correspond to the second base layers 20, and the third base layers 25 correspond to the first base layers 21. The first and second protective layers 23 and 27 contain Cr.

In the configuration shown in FIGS. 1 and 2, the first and second electrode fingers 13a and 14a have the same width W, and the distance P between each first electrode finger 13a and second electrode finger 14a is constant. The width W ranges from 0.3 to 0.7 μm, and the distance P ranges from 0.3 to 0.7 μm. In this embodiment, the second and fourth base layers 20 and 24 principally contain Ti. Each first Cu—M alloy layer 22 and second Cu—M alloy layer 26 are placed above each second base layer 20 and fourth base layer 24, respectively, with each first base layer 21 and third base layer 25, respectively, disposed therebetween. In this configuration, crystals in the first and second Cu—M alloy layers 22 and 26 are predominantly oriented in the (111) direction. Therefore, the surface acoustic wave device 11 has high resistance to stress migration.

The crystal orientation of the first and second Cu—M alloy layers 22 and 26 can be analyzed by an X-ray diffraction (XRD) method. For the crystal orientation, the XRD analysis of the first and second Cu—M alloy layers 22 and 26 shows only the (111) orientation but does not show other orientations.

Since each first base layer 21 and third base layer 25 are placed on each second base layer 20 and fourth base layer 24, respectively, these layers may have a small thickness. Thus, first and second interdigital electrodes 13 and 14 are small in mass. When the electrode mass is small, the surface acoustic wave device 11 has a large Q-factor and therefore has superior high-frequency properties.

In the surface acoustic wave device 11 of this embodiment, since the first base layers 21 are each disposed between the corresponding second base layers 20 and first Cu—M alloy layers 22 and the third base layers 25 are each disposed between the corresponding fourth base layers 24 and second Cu—M alloy layers 26, components of the second and fourth base layers 20 and 24 can be prevented from diffusing into the first and second Cu—M alloy layers 22 and 26, respectively. Therefore, the resistivity of the first and second Cu—M alloy layers 22 and 26 remains low, and the Q-factor of the surface acoustic wave device 11 remains high. Cu, which is contained in the first and second Cu—M alloy layers 22 and 26, has a resistivity of 1.7 μΩ·cm, and Al, which is contained in interdigital electrodes for known surface acoustic wave devices, has a resistivity of 2.7 μΩ·cm.

The Cu—M alloy has a melting point higher than that of Al or an Al alloy contained in such known interdigital electrodes. Therefore, even if large stresses due to high-frequencies are applied to the first and second Cu—M alloy layers 22 and 26, Cu atoms in these layers are prevented from migrating, thereby allowing the surface acoustic wave device 11 to have high resistance to stress migration. That is, the insertion loss can be prevented from being increased and the properties can be prevented from being deteriorated when high-frequency signals are applied to the surface acoustic wave device 11 and high voltages are applied thereto, thereby allowing the surface acoustic wave device 11 to have a long life.

As described above, the crystals in the first and second Cu—M alloy layers 22 and 26 are oriented in the (111) direction. The first and second Cu—M alloy layers 22 and 26 have an average size ranging from 10 to 100 nm. Since the first and second Cu—M alloy layers 22 and 26 have preferred crystal orientation and a fine average grain size, the surface acoustic wave device 11 has high resistance to stress migration.

The first and second Cu—M alloy layers 22 and 26 preferably contain crystal grains having a face-centered cubic structure, and the element M is preferably precipitated at grain boundaries.

The element M precipitated at the grain boundaries prevents Cu atoms from diffusing at the grain boundaries, thereby allowing the first and second interdigital electrodes 13 and 14 to have high strength. Thus, even if the mechanical vibration of the surface acoustic wave device 11 is increased due to applied high-frequency signals, the stress migration can be prevented from occurring in the first and second interdigital electrodes 13 and 14, thereby preventing the first and second interdigital electrodes 13 and 14 from being damaged. Furthermore, the orientation of Cu grains is improved and the electrical resistance of the first and second interdigital electrodes 13 and 14 is lowered.

The element M is, for example, Ag. The Ag content of the first and second Cu—M alloy layers 22 and 26 is 0.5 to 10% by mass and preferably 0.8 to 10% by mass. In this case, the surface acoustic wave device 11 has high dielectric strength.

If Cu layers are used instead of the first and second Cu—M alloy layers 22 and 26, crystals in the Cu layers can be oriented in the (111) direction because a pair of each second base layer 20 and first base layer 21 or a pair of each fourth base layer 24 and third base layer 25 are disposed under each Cu layer. Furthermore, the Cu layers are allowed to contain crystal grains having an average size ranging from 10 to 100 nm. Since the Cu layers have preferred crystal orientation and a fine average grain size, the surface acoustic wave device 11 has high resistance to stress migration.

Since Cu has low resistivity and a high melting point, the resistance of the first and second interdigital electrodes 13 and 14 can be prevented from being increased when the first and second interdigital electrodes 13 and 14 are reduced in size. Furthermore, even if large stresses due to high frequencies are applied to the Cu layers, Cu atoms in these layers are prevented from migrating, thereby allowing the surface acoustic wave device 11 to have high resistance to stress migration. Cu, which is contained those layers, has a melting point of 1,084° C., and Al, which is contained in the known interdigital electrodes, has a melting point of 660° C.

When a pair of each second base layer 20 and first base layer 21 or a pair of each fourth base layer 24 and third base layer 25 are disposed between the piezoelectric substrate 12 and each Cu layer or disposed between the piezoelectric substrate 12 and each first Cu—M alloy layer 22 or second Cu—M alloy layer 26, the second and fourth base layers 20 and 24 preferably have a thickness t4 ranging from 3 to 15 nm. Thereby, crystals in the first and second Cu—M alloy layers 22 and 26 or crystals in the Cu layers can be predominantly oriented in the (111) direction.

Since the second and fourth base layers 20 and 24 principally contain titanium, the first and second interdigital electrodes 13 and 14 are securely joined to the piezoelectric substrate 12.

The second and fourth base layers 20 and 24 may contain only titanium or may contain only titanium oxides.

The second and fourth base layers 20 and 24 most preferably have a configuration in which the titanium oxides are placed on a region containing only titanium and the oxygen content of the titanium oxides gradually increases from the lower faces of the second base layers 20 or fourth base layers 24 toward the upper faces thereof. Since the titanium oxides disposed under the upper faces of the second base layers 20 or fourth base layers 24 are substantially amorphous, the first base layers 21 and third base layers 25 each disposed on the corresponding second base layer 20 and fourth base layer 24, respectively, are hardly affected by the crystallinity of the second and fourth base layers 20 and 24. Thereby, the first and third base layers 21 and 25 have a small grain size. Furthermore, the first Cu—M alloy layers 22 and second Cu—M alloy layers 26 each disposed on the corresponding first and third base layers 21 and 25, respectively, or the Cu layers each disposed on the corresponding first and third base layers 21 and 25 have a small grain size. When the first and second Cu—M alloy layers 22 and 26 or the Cu layers have a small grain size, crystals in the first and second Cu—M alloy layers 22 and 26 or the Cu layers are predominantly oriented in the (111) direction, thereby allowing the surface acoustic wave device 11 to have high resistance to stress migration.

Figure 3:
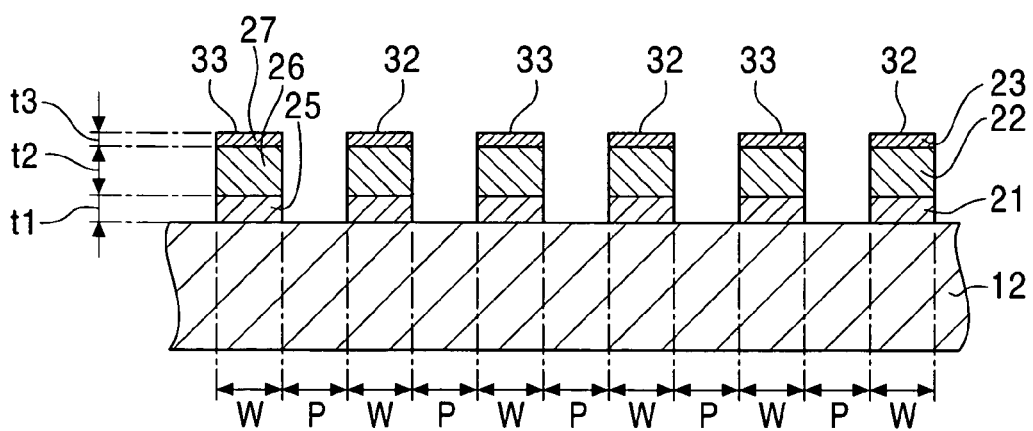
FIG. 3 is a sectional view showing interdigital electrodes of a surface acoustic wave device according to a second embodiment of the present invention.
Figure 3:
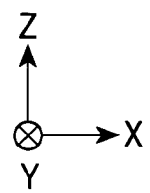

FIG. 3 is a sectional view showing interdigital electrodes of a surface acoustic wave device according to a second embodiment of the present invention.

This surface acoustic wave device shown in FIG. 3 is different in configuration from the surface acoustic wave device 11 shown in FIGS. 1 and 2. That is, the surface acoustic wave device of this embodiment includes a piezoelectric substrate 12, third electrode fingers 32, and fourth electrode fingers 33. The third and fourth electrode fingers 32 and 33 each include corresponding first base layers 21 and third base layers 25, respectively, and do not include the second base layers 20 and fourth base layers 24 shown in FIGS. 1 and 2. In the surface acoustic wave device of this embodiment, the first and third base layers 21 and 25 are directly placed on the piezoelectric substrate 12.

The third and fourth electrode fingers 32 and 33 correspond to the first and second electrode fingers 13a and 14a, respectively, shown in FIG. 2 and have the same shape as that of the first and second electrode fingers 13a and 14a shown in FIG. 1 when viewed from above. The surface acoustic wave device of this embodiment includes electrode sections and reflective electrodes, which are not shown. These electrode sections and reflective electrodes have the same configurations as those of the first and second electrode sections 17 and 18 and reflective electrodes 19, respectively, shown in FIG. 1.

In the above configuration in which the first and third base layers 21 and 25 are directly placed on the piezoelectric substrate 12, crystals in first Cu—M alloy layers 22 and second Cu—M alloy layers 26 each disposed on the corresponding first and third base layers 21 and 25, respectively, can be oriented in the (111) direction. Furthermore, the first and second Cu—M alloy layers 22 and 26 are allowed to have an average grain size ranging from 10 to 100 nm. Since the first and second Cu—M alloy layers 22 and 26 have preferred crystal orientation and a fine average grain size, the surface acoustic wave device of this embodiment has high resistance to stress migration.

In this embodiment, the first and second Cu—M alloy layers 22 and 26 also preferably contain crystal grains having a face-centered cubic structure, and the element M is preferably precipitated at grain boundaries.

The element M precipitated at the grain boundaries prevents Cu atoms from diffusing at the grain boundaries, thereby allowing the interdigital electrodes of this embodiment to have high strength. Thus, even if the mechanical vibration of this surface acoustic wave device is increased due to applied high-frequency signals, the stress migration can be prevented from occurring in the interdigital electrodes, thereby preventing the interdigital electrodes from being damaged. Furthermore, the orientation of the Cu grains is improved and the resistance of the interdigital electrodes is lowered.

The element M is, for example, Ag. The Ag content of the first and second Cu—M alloy layers 22 and 26 is 0.5 to 10% by mass and preferably 0.8 to 10% by mass. In this case, the surface acoustic wave device has high dielectric strength.

If Cu layers are used instead of the first and second Cu—M alloy layers 22 and 26, crystals in the Cu layers can be oriented in the (111) direction. Furthermore, the Cu layers are allowed to have an average size ranging from 10 to 100 nm. Since the Cu layers have preferred crystal orientation and a fine average grain size, the surface acoustic wave device 11 has high resistance to stress migration.

Since Cu has low resistivity and a high melting point, the resistance of the interdigital electrodes can be prevented from being increased when the interdigital electrodes are reduced in size. Furthermore, even if large stresses due to high-frequencies are applied to the Cu layers, Cu atoms in Cu layers are prevented from migrating, thereby allowing the surface acoustic wave device to have high resistance to stress migration.

When only a pair of each first base layer 21 and third base layer 25 are disposed between the piezoelectric substrate 12 and each Cu layer or disposed between the piezoelectric substrate 12 and each first Cu—M alloy layer 22 or second Cu—M alloy layer 26, the first and third base layers 21 and 25 preferably have a thickness t1 ranging from 5 to 15 nm. Thereby, crystals in the first and second Cu—M alloy layers 22 and 26 can be predominantly oriented in the (111) direction.

The first and second Cu—M alloy layers 22 and 26 shown in FIGS. 2 and 3 preferably has a thickness t2 ranging from 30 to 150 nm.

First protective layers 23 and second protective layers 27 containing Cr are each disposed on the corresponding first and second Cu—M alloy layers 22 and 26, respectively, or disposed on the corresponding Cu layers, thereby preventing the first and second Cu—M alloy layers 22 and 26 or the Cu layers from being oxidized and/or corroded. The first and second protective layers 23 and 27 have a thickness t3 ranging from 1 to 10 nm.

A process for manufacturing the surface acoustic wave device 11 of the first embodiment shown in FIG. 2 will now be described.

FIGS. 4 to 7 are sectional views showing steps of forming the first and second interdigital electrodes 13 and 14 of the surface acoustic wave device 11.

Figure 4:
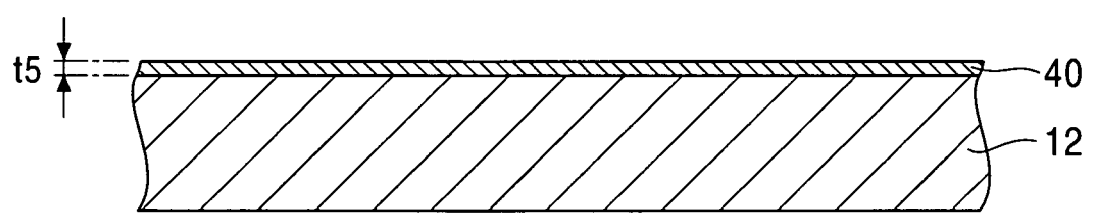
FIG. 4 is an illustration showing a step of manufacturing the surface acoustic wave device shown in FIGS. 1 and 2.

In a step shown in FIG. 4, a Ti layer 40 is formed on the piezoelectric substrate 12 containing LiTaO$_3$ or LiNbO$_3$ by a sputtering process or vapor deposition process. The Ti layer 40 is etched in a subsequent step, whereby the second and fourth base layers 20 and 24 are formed. The Ti layer 40 has a thickness t5 ranging from 3 to 15 nm. After the Ti layer 40 is formed, the Ti layer 40 is exposed to the atmosphere, thereby oxidizing the Ti layer 40.

As a result, the Ti layer 40 has a configuration in which titanium oxides are disposed on a region containing only titanium. The oxygen content of the titanium oxides gradually increases from the lower face of the Ti layer 40 toward the upper face thereof. The titanium oxides disposed under the upper face of the Ti layer 40 are substantially amorphous.

Figure 5:
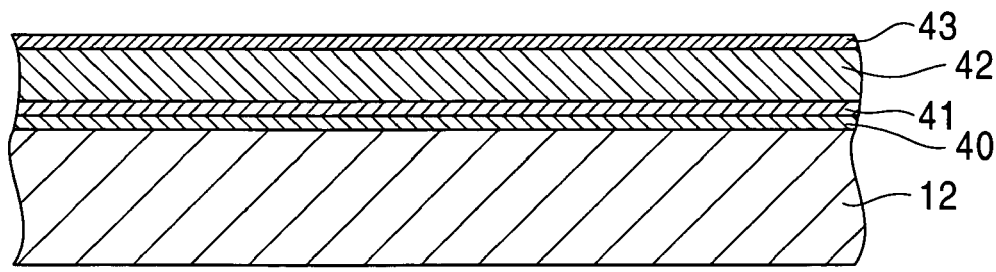
FIG. 5 is an illustration showing a step subsequent to the step shown in FIG. 4.

In a step shown in FIG. 5, a Ta layer 41, Cu—M alloy precursor layer 42, and Cr layer 43 are formed on the resulting Ti layer 40 in that order, wherein M represents one or more elements selected from the group consisting of Ag, Sn, and C. The Ta layer 41 is formed into the first and third base layers 21 and 25, the Cu—M alloy precursor layer 42 is formed into the first and second Cu—M alloy layers 22 and 26, and the Cr layer 43 is formed into the first and second protective layers 23 and 27 in respective subsequent steps.

In the manufacturing process of this embodiment, the titanium oxides disposed under the upper face of the Ti layer 40 are substantially amorphous. Therefore, the Ta layer 41 disposed on the Ti layer 40 is hardly affected by the crystallinity of titanium. Thereby, the Ta layer 41 has a small grain size, and the Cu—M alloy precursor layer 42 disposed on the Ta layer 41 also has a small grain size. When the Cu—M alloy precursor layer 42 has a small grain size, crystals in the Cu—M alloy precursor layer 42 are predominantly oriented in the (111) direction, thereby allowing the Cu—M alloy precursor layer 42 to have high resistance to stress migration.

In this embodiment, the Cu—M alloy precursor layer 42 may have a grain size ranging from 10 to 100 nm.

A method for detecting the titanium oxides and determining the concentration gradient thereof includes SIMS analysis, nano-beam EDX analysis using a transmission electron microscope (TEM), and so on.

Depending on the temperature and time of the step of exposing the Ti layer 40 to the atmosphere, the resulting Ti layer 40 hardly contains the titanium oxides or contains only the titanium oxides. In the present invention, the second base layers include both cases.

When the surface acoustic wave device 11 shown in FIGS. 1 and 2 is prepared, the Ti layer 40, Ta layer 41, Cu—M alloy precursor layer 42, and Cr layer 43 may be continuously formed on the piezoelectric substrate 12 in that order without exposing the Ti layer 40 to the atmosphere, wherein M is as specified in the above. In this case, since the Ta layer 41 is continuously formed on the Ti layer 40, the Ti layer 40 is not oxidized.

If the Ti layer 40 contains no titanium oxides, the crystals in the Cu—M alloy precursor layer 42 can be predominantly oriented in the (111) direction because a layered structure consisting of the Ta layer 41 and the Ti layer 40 is placed under the Cu—M alloy layer 42. The crystals in the Cu—M alloy precursor layer 42 disposed above the piezoelectric substrate 12 with the Ta layer 41 and the Ti layer 40 disposed therebetween are more predominantly oriented in the (111) direction as compared with the crystals in the Cu—M alloy precursor layer 42 disposed above the piezoelectric substrate 12 with only the Ti layer 40 disposed therebetween.

Figure 6:
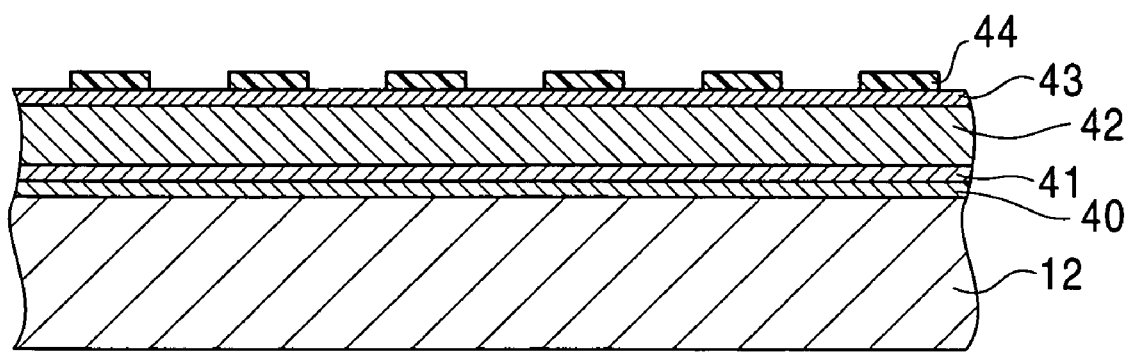
FIG. 6 is an illustration showing a step subsequent to the step shown in FIG. 5.

In a step shown in FIG. 6, a mask layer 44, disposed on the Cr layer 43, containing a resist material is patterned by a photolithographic process and etching process. The resulting mask layer 44 has the same pattern as that of the first and second interdigital electrodes 13 and 14 shown in FIG. 1 when viewed from above.

Figure 7:
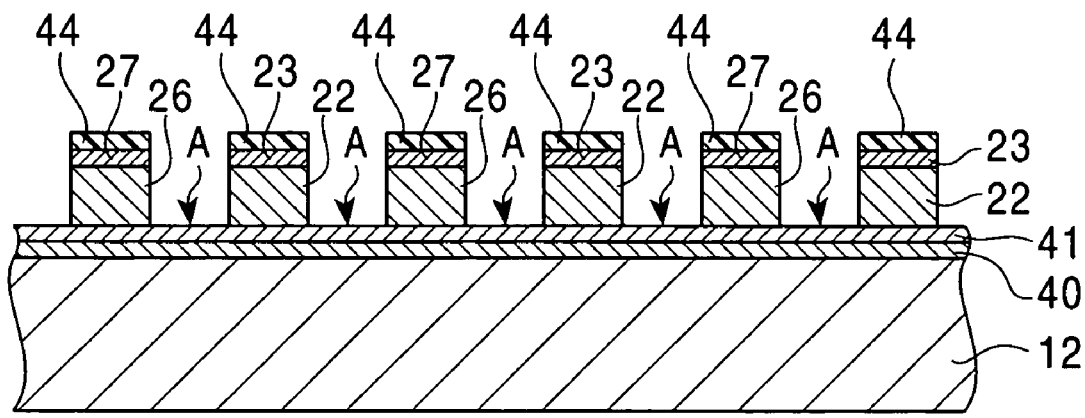
FIG. 7 is an illustration showing a step subsequent to the step shown in FIG. 6.

In a step shown in FIG. 7, the Cu—M alloy precursor layer 42 and Cr layer 43 are dry-etched using the mask layer 44 as a mask so as to form an interdigital pattern, thereby obtaining the first and second Cu—M alloy layers 22 and 26. In this step of etching the Cu—M alloy precursor layer 42 and Cr layer 43, the Ta layer 41 functions as an etching stopper layer, and therefore the Ti layer 40 and piezoelectric substrate 12 disposed under the Ta layer 41 are prevented from being damaged. In order to allow the Ta layer 41 to function as such an etching stopper layer, the Ta layer 41 must have a thickness of 5 nm or more.

The mask layer 44 and portions of the Ti layer 40 and Ta layer 41 are simultaneously removed by a dry etching process, the portions being each disposed under corresponding regions A that are not covered with the mask layer 44 and each disposed between the corresponding first and second Cu—M alloy layers 22 and 26. Thereby, each first base layer 21 and second base layer 20 are formed under each first Cu—M alloy layer 22, and each third base layer 25 and fourth base layer 24 are formed under each second Cu—M alloy layer 26. These layers are arranged in an interdigital pattern when viewed from above. Each second base layer 20, first base layer 21, first Cu—M alloy layer 22, and first protective layer 23 form each first interdigital electrode 13, and each fourth base layer 24, third base layer 25, second Cu—M alloy layer 26, and second protective layer 27 form each second interdigital electrode 14.

The following components are then formed: the first junction electrodes 15 to be each connected to the corresponding first interdigital electrodes 13 and the second junction electrodes 16 to be each connected to the corresponding second interdigital electrodes 14. The piezoelectric substrate 12 having the first and second interdigital electrodes 13 and 14 and the first and second junction electrodes 15 and 16 thereon is heat-treated.

After the heat treatment, the surface acoustic wave device 11 shown in FIGS. 1 and 2 is obtained.

In the manufacturing process of this embodiment, since the first and second interdigital electrodes 13 and 14 of the surface acoustic wave device 11 contain a Cu—M alloy, the first electrode fingers 13a of the first interdigital electrodes 13 and the second electrode fingers 14a of the second interdigital electrodes 14 can be prevented from being increased in electrical resistance when these fingers are reduced in size. Furthermore, even if large stresses due to high-frequencies are applied to the first and second interdigital electrodes 13 and 14, Cu atoms in these electrodes are prevented from migrating, thereby allowing the surface acoustic wave device 11 to have high resistance to stress migration.

In this embodiment, the element M in the Cu—M alloy is precipitated at grain boundaries during the heat treatment when the first and second interdigital electrodes 13 and 14 including the first and second Cu—M alloy layers 22 and 26, respectively, are formed. The precipitated element M prevents Cu atoms from diffusing at the grain boundaries, thereby allowing the first and second interdigital electrodes 13 and 14 to have high strength. That is, if high-frequency signals are input to the surface acoustic wave device 11 and thereby the mechanical vibration thereof is increased, the stress migration is prevented from occurring in the first and second interdigital electrodes 13 and 14 and therefore the first and second interdigital electrodes 13 and 14 are hardly damaged. Furthermore, the orientation of Cu crystal grains is improved. The electrical resistance of the first and second interdigital electrodes 13 and 14 is lowered.

The element M is, for example, Ag. The Ag content of the first and second Cu—M alloy layers 22 and 26 is preferably 0.5 to 10% by mass and more preferably 0.8 to 10% by mass. In this case, the surface acoustic wave device 11 has high dielectric strength.

The temperature of the heat treatment preferably ranges from 250 to 300° C., whereby the surface acoustic wave device 11 can be effectively improved in dielectric strength.

Since the first and second protective layers 23 and 27 containing Cr are disposed on the first and second Cu—M alloy layers 22 and 26, respectively, the first and second Cu—M alloy layers 22 and 26 can be prevented from being oxidized and corroded.

According to the manufacturing process of this embodiment, the second and fourth base layers 20 and 24 having the following configuration can be formed: the titanium oxides are disposed on the regions containing only titanium and the oxygen content of the titanium oxides gradually increases from the lower faces of the second and fourth base layers 20 and 24 toward the upper faces thereof.

In the manufacturing process of this embodiment, the first and second interdigital electrodes 13 and 14 including the second and fourth base layers 20 and 24, respectively, shown in FIG. 2 can be obtained.

When the surface acoustic wave device of the second embodiment shown in FIG. 3 is manufactured, the step of forming the Ti layer 40 shown in FIG. 4 is omitted and the Ta layer 41, the Cu—M alloy precursor layer 42, and the Cr layer 43 are formed on the piezoelectric substrate 12 in that order.

A layer containing only Cu may be formed instead of the Cu—M alloy precursor layer 42. The surface acoustic wave device 11 shown in FIG. 1 includes the first and second electrode sections 17 and 18 that are disposed between a pair of the reflective electrodes 19 and arranged in the X direction. However, the surface acoustic wave device 11 may include one of the first and second electrode sections 17 and 18 disposed between the reflective electrodes 19 or may include three or more electrode sections disposed between the reflective electrodes 19.

A surface acoustic wave device of the present invention is fit for resonators and filters, which are components of antenna duplexers. However, uses of the surface acoustic wave device are not limited to such components for antenna duplexers. The surface acoustic wave device 11 can be used for general resonators and filters.

EXAMPLES

Example 1

Samples each including a piezoelectric substrate and interdigital electrodes each disposed thereon were prepared, wherein the interdigital electrodes each include corresponding first base layers, Cu—Ag alloy layers, and protective layers each disposed in that order. The samples were investigated for a correlation between the thickness of the first base layers and the (111) orientation of crystals in the Cu—Ag alloy layers.

Each sample was prepared as follows: each first base layer containing Ta, Cu—Ag alloy layer, and protective layer containing Cr were formed on each piezoelectric substrate containing $LiTaO_3$ in that order by a sputtering process. The obtained samples were then heat-treated. The thickness of the Cu—Ag alloy layers was 80 nm and the thickness of the protective layers was 5 nm. The thickness of the first base layers was varied within a range of 5 to 15 nm. The temperature of the heat treatment was 275° C. and the time of the heat treatment was one hour. The samples were examined for the (111) orientation of crystals in the Cu—Ag alloy layers by X-ray diffraction analysis before and after the heat treatment.

Figure 8:
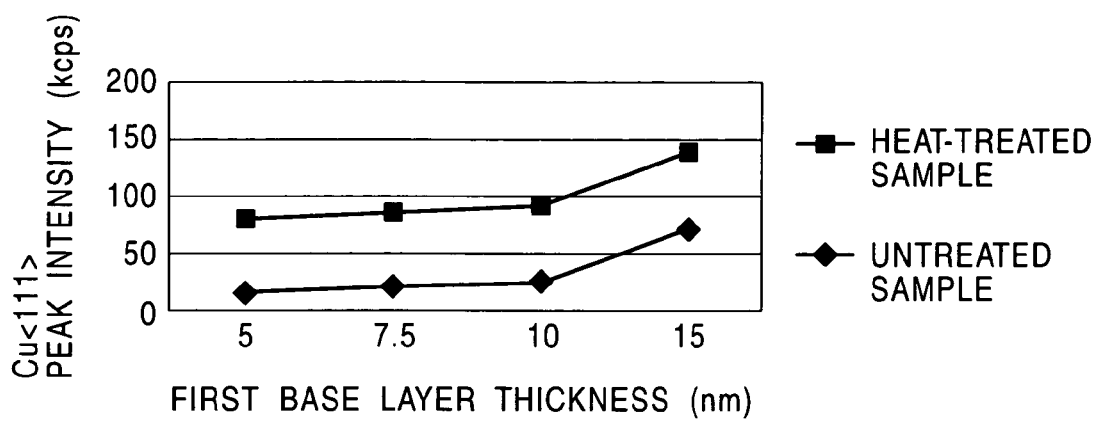
FIG. 8 is a graph showing the relationship between the thickness of a first base layer and the (111) orientation of crystals in a Cu—Ag alloy layer, wherein the first base layer, the Cu—Ag alloy layer, and a protective layer are disposed in that order and included in an interdigital electrode.

Obtained results are shown in FIG. 8. FIG. 8 shows that every sample has a peak assigned to the (111) plane of a Cu—Ag alloy whether the sample has been heat-treated or not, wherein the sample includes each first base layer containing Ta and Cu—Ag alloy layer disposed thereon as described above.

For the untreated samples, each peak assigned to the Cu—Ag alloy (111) plane has an intensity of about 15 kcps when the first base layer has a thickness of 5 nm. The intensity of the peaks is in proportion to the thickness of the first base layer, and sharply increases when the first base layer thickness exceeds 10 nm. The peak intensity is about 20 kcps when the first base layer has a thickness of 10 nm and the peak intensity is about 60 kcps when the first base layer has a thickness of 15 nm.

Furthermore, for the peaks assigned to the Cu—Ag alloy (111) plane, FIG. 8 shows that the heat-treated samples have a peak intensity larger than that of the untreated samples irrespective of first base layer thickness and also shows that a difference in intensity between the heat-treated and untreated samples is substantially constant.

In the heat-treated samples, for the peaks assigned to the Cu—Ag alloy (111) plane, the intensity is about 80 kcps when the first base layers have a thickness of 5 nm. The peak intensity sharply increases when the first base layer thickness exceeds 10 nm. The peak intensity is about 100 kcps when the layer thickness is 10 nm, and the peak intensity is about 140 kcps when the layer thickness is 15 nm.

For the Cu—Ag alloy, there are no peaks other than the peak assigned to the (111) plane in the above results.

Example 2

Samples including a piezoelectric substrate and interdigital electrodes each disposed thereon were prepared, wherein the interdigital electrodes each include corresponding second base layers, first base layers, Cu—Ag alloy layers, and protective layers each disposed in that order. The samples were investigated for a correlation between the thickness of the first base layers and the (111) orientation of crystals in the Cu—Ag alloy layers.

Each sample was prepared as follows: each second base layer containing Ti, first base layer containing Ta, Cu—Ag alloy layer, and protective layer containing Cr were formed on each piezoelectric substrate containing $LiTaO_3$ in that order by a sputtering process. The obtained samples were then heat-treated. The thickness of the first base layers was 5 nm, the thickness of the Cu—Ag alloy layers was 80 nm, and the thickness of the protective layers was 5 nm. The thickness of the second base layers was varied within a range of 3 to 15 nm. The temperature of the heat treatment was 275° C. and the time of the heat treatment was one hour.

The samples were examined for the (111) orientation of crystals in the Cu—Ag alloy layers by X-ray diffraction analysis before and after the heat treatment.

Figure 9:
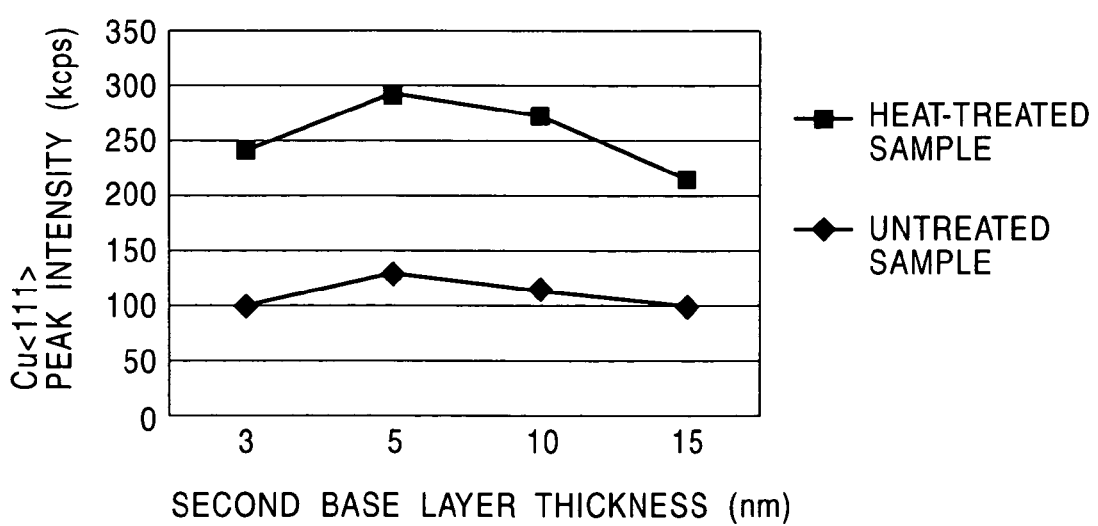
FIG. 9 is a graph showing the relationship between the thickness of a second base layer and the (111) orientation of crystals in a Cu—Ag alloy layer, wherein the second base layer, a first base layer, the Cu—Ag alloy layer, and a protective layer are disposed in that order and included in an interdigital electrode.

Obtained results are shown in FIG. 9. FIG. 9 shows that every sample has a peak assigned to the (111) plane of Cu—Ag alloy whether the sample has been heat-treated or not and each peak has an intensity of 100 kcps or more, wherein the sample includes each second base layer that contains Ti, has a thickness of 3 to 15 nm, and is disposed under a layered structure consisting of each first base layer containing Ta and Cu—Ag alloy layer. In particular, in the heat-treated samples, each peak assigned to the (111) plane has an intensity of 200 kcps or more irrespective of layer thickness. In the heat-treated samples and untreated samples, for the peaks assigned to the (111) plane, the intensity is the largest when each second base layer has a thickness of 5 nm. In the untreated samples, the peak intensity is about 130 kcps when the second base layer has a thickness of 5 nm. In heat-treated samples, the peak intensity is about 300 kcps when the second base layer has a thickness of 5 nm.

In the samples of Example 2, the peak intensity associated with the (111) plane is larger than that of the samples of Example 1, because the samples of Example 2 include the second base layers and first base layers disposed on the piezoelectric substrates and the samples of Example 1 include the first base layers directly disposed on the piezoelectric substrates.

Therefore, in the samples of Example 2, even if the first and second base layers have a small thickness, crystals in the Cu—Ag alloy layers can be predominantly oriented in the (111) direction; hence, the interdigital electrodes can be reduced in mass. Surface acoustic wave devices including such lightweight interdigital electrodes have a large Q-factor and therefore have superior high-frequency properties.

In the samples of Example 2, for the Cu—Ag alloy, there are no peaks other than the peaks associated with the (111) orientation.

For the samples of Examples 1 and 2, it is presumed that the (111) orientation is dominant in the Cu—Ag alloy layers because the first base layers have a fine crystal structure, namely a so-called island structure. In particular, the first base layers of Example 2 have a more fine crystal structure because the first base layers are each disposed on the corresponding second base layers as compared with the first base layers of Example 1 which are each directly disposed on the corresponding piezoelectric substrates.

Samples similar to the surface acoustic wave device 11 shown in FIG. 2 were prepared, and the following relationships were examined: the relationship between the dielectric strength of the samples and the Ag content of the Cu—Ag alloy layers each included in the corresponding interdigital electrodes of the samples and the relationship between the dielectric strength of the samples and a temperature for heat-treating the samples having the interdigital electrodes.

The dielectric strength of the samples was measured by a step-stress method and the procedure was as follows: a current applied to each sample was increased step by step while input signals having an anti-resonant frequency were applied to the sample, whereby the critical current was determined when an electrical breakdown occurred in the sample.

Dimensions of components of the interdigital electrode are described below.

Width W of electrode fingers: 0.5 µm
Pitch P of electrode fingers: 0.5 µm
Length L of electrode fingers: 100 µm
Thickness of Cu—Ag alloy layers: 80 nm
Piezoelectric substrates of the samples contained $LiTaO_3$.
In this example, in order to maximize the stress migration of the samples, the input signals having an anti-resonant frequency ranging from 1.8 to 2.0 GHz were used.

Figure 10:
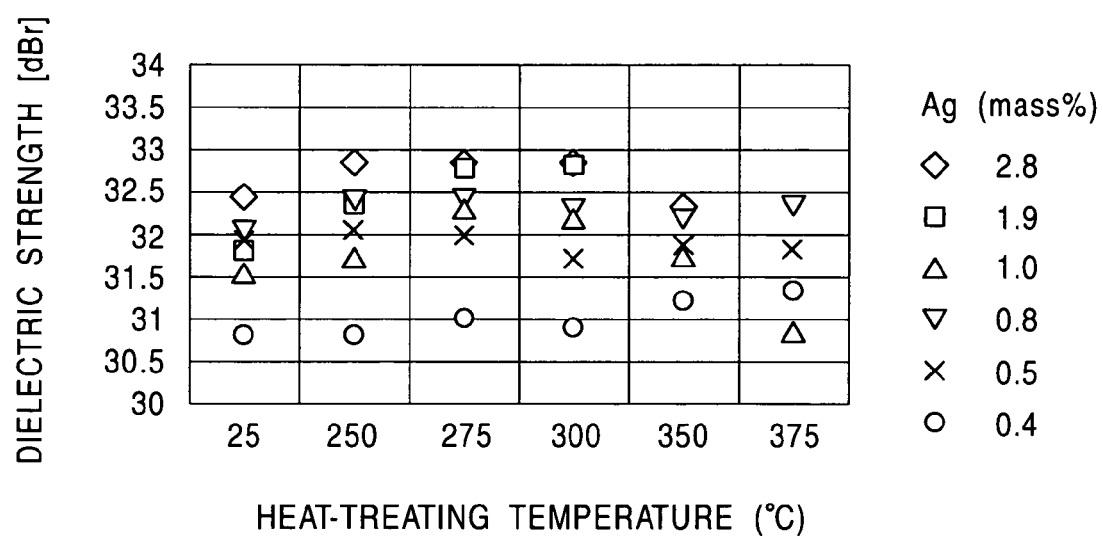
FIG. 10 is a graph showing the relationship between the Ag content of each Cu—Ag alloy layer and the dielectric strength of a surface acoustic wave device and also showing the relationship between the dielectric strength of the surface acoustic wave device and the temperature for heat-treating the surface acoustic wave device including interdigital electrodes each including the corresponding Cu—Ag alloy layers.

Obtained results are shown in FIG. 10. FIG. 10 shows that the samples, heat-treated at 250° C. or more, including the Cu—Ag alloy layers containing at least 0.8% by mass of Ag have a critical current larger than that of the untreated samples, which have been left at room temperature (25° C.). However, the samples, heat-treated at 350° C. or more, including the Cu—Ag alloy layers containing 2.8% by mass of Ag have a critical current smaller than that of the untreated samples. One of the samples, heat-treated at 375° C., including each Cu—Ag alloy layer containing 1.0% by mass of Ag has a critical current smaller than that of the untreated samples.

According to the above results, in the manufacturing process of the present invention, the temperature for heat-treating a surface acoustic wave device including interdigital electrodes is preferably 250 to 300° C.

Furthermore, FIG. 10 shows that the critical current of the samples is in proportion to the Ag content of the Cu—Ag alloy layers.

In particular, the samples including the Cu—Ag alloy layers containing at least 0.5% by mass of Ag have a critical current of 1 W or more, that is, such samples have a dielectric strength that is preferable in practical use.

When the Ag content of the Cu—Ag alloy layers is 10% by mass or more, the interdigital electrodes have high electrical resistance. Therefore, the samples including such interdigital electrodes have high insertion loss and therefore are inferior in high-frequency property.

Accordingly, in a surface acoustic wave device of the present invention, when the device includes Cu—Ag alloy layers, the Ag content of the Cu—Ag alloy layers is preferably 0.5 to 10% by mass and more preferably 0.8 to 10% by mass.

The present invention is as described above with reference to the preferred embodiments; however, various modifications may be performed within the scope of the present invention.

The above-mentioned embodiments and examples are given only as illustrations, and the present invention is not limited to the embodiments and examples.

In a surface acoustic wave device of the present invention described above in detail, interdigital electrodes each include corresponding Cu layers or Cu—M layers having low resistivity and a high melting point. Thus, if the interdigital electrodes are reduced in size, the electrical resistance thereof can be prevented from being increased. Furthermore, even if large stresses due to high frequencies are applied to these layers, Cu atoms in the layers are prevented from migrating, thereby allowing the surface acoustic wave device to have high resistance to stress migration. That is, when high-frequency signals and a large voltage are applied the surface acoustic wave device, the insertion loss of the surface acoustic wave device can be prevented from being increased and properties of the device can be prevented from being deteriorated; hence, the device has a long life.

In a surface acoustic wave device of the present invention, since Cu layers or Cu—M alloy layers are each disposed on corresponding first base layers containing Ta, the Cu layers or Cu—M layers have preferred crystal orientation and a fine average grain size. Therefore, the surface acoustic wave device has high resistance to stress migration.

Furthermore, in the present invention, in order to improve the stress migration of a surface acoustic wave device, crystals in Cu layers or Cu—M alloy layers can be oriented in the (111) direction.

The average grain size of the Cu layers or Cu—M alloy layers can be controlled within a range of 10 to 100 nm.

The Cu—M alloy layers are allowed to have a configuration in which crystal grains have a face-centered cubic structure and the element M is precipitated at grain boundaries.

The precipitated element M prevents Cu atoms, contained in the Cu—M alloy layers, from diffusing at the grain boundaries, thereby enhancing the strength of interdigital electrodes. That is, if high-frequency signals are input to the surface acoustic wave device and thereby the mechanical vibration thereof is increased, the stress migration is prevented from occurring in the interdigital electrodes; hence the interdigital electrodes are hardly damaged. Furthermore, the orientation of Cu crystal grains is improved. The electrical resistance of the interdigital electrodes is lowered.

The element M is, for example, Ag. When the Cu—M alloy layers contain 0.5 to 10% by mass of Ag, the surface acoustic wave device has high dielectric strength.

In the present invention, since second base layers containing titanium and/or titanium oxides are each disposed under corresponding first base layers, crystals in the Cu layers or Cu—M alloy layers can be predominantly oriented in the (111) direction, thereby allowing a surface acoustic wave device to have high resistance to stress migration.

Since the second base layers are disposed under the first base layers, the first and second base layers are allowed to have a small thickness and therefore interdigital electrodes are allowed to have a small mass. When the electrode mass is small, the surface acoustic wave device has high dielectric strength and therefore has superior high-frequency properties.

Since each first base layer is disposed between each second base layer and each Cu layer or Cu—M alloy layer, components of the second base layer are prevented from diffusing into the Cu layer or Cu—M alloy layer. Therefore, the resistivity of the Cu layer or Cu—M alloy layer which is originally small can be maintained small. Thus, the surface acoustic wave device has a large Q-factor.

What is claimed is:

1. A surface acoustic wave device comprising:
   a piezoelectric substrate; and
   an electrode section, disposed on the piezoelectric substrate, having a thin-film structure,
   wherein the electrode section includes interdigital electrodes and junction electrodes connected to the interdigital electrodes, and the interdigital electrodes each include corresponding first base layers containing Ta and Cu layers or Cu—M alloy layers each disposed on the corresponding first base layers, where M represents one or more elements selected from the group consisting of Ag, Sn, and C.

2. The surface acoustic wave device according to claim 1, wherein the Cu layers or Cu—M alloy layers have a crystal structure in which crystals are oriented in a (111) direction.

3. The surface acoustic wave device according to claim 2, wherein the Cu layers or Cu—M alloy layers have an average grain size ranging from 10 to 100 nm.

4. The surface acoustic wave device according to claim 1, wherein the Cu layers or Cu—M alloy layers contain crystal grains having a face-centered cubic structure and the element M is precipitated at grain boundaries.

5. The surface acoustic wave device according to claim 1, wherein the element M is Ag and an Ag content of the Cu—M alloy layers ranges from 0.5 to 10% by mass.

6. The surface acoustic wave device according to claim 5, wherein the Ag content of the Cu—M alloy layers ranges from 0.8 to 10% by mass.

7. The surface acoustic wave device according to claim 1, further comprising second base layers each disposed under the corresponding first base layers, wherein the second base layers contain at least one of titanium or a titanium oxides.

8. The surface acoustic wave device according to claim 7, wherein the second base layers have a configuration in which the titanium oxides are disposed on a region containing only titanium and an oxygen content of the titanium oxides gradually increases from lower faces of the second base layers toward upper faces.

9. The surface acoustic wave device according to claim 1, wherein the first base layers have a thickness ranging from 5 to 15 nm.

10. The surface acoustic wave device according to claim 7, wherein the second base layers have a thickness ranging from 3 to 15 nm.

11. The surface acoustic wave device according to claim 1, wherein the Cu layers or Cu—M alloy layers have a thickness ranging from 30 to 150 nm.

12. The surface acoustic wave device according to claim 1, further comprising protective layers, each disposed on the corresponding Cu layers or Cu—M alloy layers, containing Cr.

* * * * *

UNITED STATES PATENT AND TRADEMARK OFFICE
CERTIFICATE OF CORRECTION

| | | |
|---|---|---|
| PATENT NO. | : 7,026,743 B2 | Page 1 of 1 |
| APPLICATION NO. | : 10/689811 | |
| DATED | : April 11, 2006 | |
| INVENTOR(S) | : Haruhiko Fujimoto et al. | |

It is certified that error appears in the above-identified patent and that said Letters Patent is hereby corrected as shown below:

<u>In the Claims</u>

Column 18, in claim 7, line 4, after "or a titanium" delete "oxides" and substitute --oxide-- in its place.

Signed and Sealed this

Thirty-first Day of October, 2006

JON W. DUDAS
*Director of the United States Patent and Trademark Office*